US007060632B2

(12) United States Patent
Fitzgerald et al.

(10) Patent No.: US 7,060,632 B2
(45) Date of Patent: Jun. 13, 2006

(54) METHODS FOR FABRICATING STRAINED LAYERS ON SEMICONDUCTOR SUBSTRATES

(75) Inventors: Eugene Fitzgerald, Windham, NH (US); Matthew Currie, Windham, NH (US)

(73) Assignee: AmberWave Systems Corporation, Salem, NH (US)

( * ) Notice: Subject to any disclaimer, the term of this patent is extended or adjusted under 35 U.S.C. 154(b) by 0 days.

(21) Appl. No.: 10/389,003

(22) Filed: Mar. 14, 2003

(65) Prior Publication Data

US 2003/0215990 A1    Nov. 20, 2003

Related U.S. Application Data

(60) Provisional application No. 60/364,733, filed on Mar. 14, 2002.

(51) Int. Cl.
*H01L 21/31* (2006.01)
(52) U.S. Cl. .................................................. 438/767
(58) Field of Classification Search ............... 438/758, 438/763, 767, 578; 117/89, 84, 103, 104; 257/18, 19, E29.193
See application file for complete search history.

(56) References Cited

U.S. PATENT DOCUMENTS

| 3,935,040 A | 1/1976 | Mason ......................... 438/23 |
| 4,010,045 A | 3/1977 | Ruehrwein |
| 4,704,302 A | 11/1987 | Bruel et al. |
| 4,710,788 A | 12/1987 | Dambkes et al. |
| 4,969,031 A | 11/1990 | Kobayashi et al. |
| 4,987,462 A | 1/1991 | Kim et al. |
| 4,990,979 A | 2/1991 | Otto |
| 4,997,776 A | 3/1991 | Harame et al. .............. 438/313 |
| 5,013,681 A | 5/1991 | Godbey et al. |
| 5,155,571 A | 10/1992 | Wang et al. .................. 357/42 |
| 5,166,084 A | 11/1992 | Pfiester |
| 5,177,583 A | 1/1993 | Endo et al. |
| 5,202,284 A | 4/1993 | Kamins et al. |
| 5,207,864 A | 5/1993 | Bhat et al. |
| 5,208,182 A | 5/1993 | Narayan et al. |
| 5,212,110 A | 5/1993 | Pfiester et al. |
| 5,221,413 A | 6/1993 | Brasen et al. .................. 117/89 |
| 5,240,876 A | 8/1993 | Gaul et al. |
| 5,241,197 A | 8/1993 | Murakami et al. |

(Continued)

FOREIGN PATENT DOCUMENTS

DE    41 01 167    7/1992

(Continued)

OTHER PUBLICATIONS

M. Kummer et al., "Low energy plasma enhanced chemical vapor deposition," *Materials Science and Engineering B89* (2002) pp. 288-295.

(Continued)

*Primary Examiner*—Brook Kebede
(74) *Attorney, Agent, or Firm*—Goodwin Procter LLP (57) ABSTRACT

Methods for fabricating multi-layer semiconductor structures including strained material layers using a minimum number of process tools and under conditions optimized for each layer. Certain regions of the strained material layers are kept free of impurities that can interdiffuse from adjacent portions of the semiconductor. When impurities are present in certain regions of the strained material layers, there is degradation in device performance. By employing semiconductor structures and devices (e.g., field effect transistors or "FETs") that have the features described, or are fabricated in accordance with the steps described, device operation is enhanced.

54 Claims, 3 Drawing Sheets

U.S. PATENT DOCUMENTS

| | | | |
|---|---|---|---|
| 5,250,445 A | 10/1993 | Bean et al. ................ 438/474 |
| 5,285,086 A | 2/1994 | Fitzgerald |
| 5,291,439 A | 3/1994 | Kauffmann et al. |
| 5,298,452 A | 3/1994 | Meyerson |
| 5,310,451 A | 5/1994 | Tejwani et al. |
| 5,316,958 A | 5/1994 | Meyerson |
| 5,346,848 A | 9/1994 | Grupen-Shemansky et al. |
| 5,374,564 A | 12/1994 | Bruel |
| 5,399,522 A | 3/1995 | Ohori ........................ 438/493 |
| 5,413,679 A | 5/1995 | Godbey |
| 5,424,243 A | 6/1995 | Takasaki |
| 5,426,069 A | 6/1995 | Selvakumar et al. ........ 437/131 |
| 5,426,316 A | 6/1995 | Mohammad |
| 5,442,205 A | 8/1995 | Brasen et al. .............. 257/191 |
| 5,461,243 A | 10/1995 | Ek et al. ..................... 257/190 |
| 5,461,250 A | 10/1995 | Burghartz et al. |
| 5,462,883 A | 10/1995 | Dennard et al. |
| 5,476,813 A | 12/1995 | Naruse |
| 5,479,033 A | 12/1995 | Baca et al. |
| 5,484,664 A | 1/1996 | Kitahara et al. |
| 5,523,243 A | 6/1996 | Mohammad |
| 5,523,592 A | 6/1996 | Nakagawa et al. .......... 257/96 |
| 5,534,713 A | 7/1996 | Ismail et al. ................ 257/192 |
| 5,536,361 A | 7/1996 | Kondo et al. |
| 5,540,785 A | 7/1996 | Dennard et al. |
| 5,548,128 A | 8/1996 | Soref et al. |
| 5,572,043 A | 11/1996 | Shimizu et al. |
| 5,596,527 A | 1/1997 | Tomioka et al. |
| 5,607,876 A | 3/1997 | Biegelsen et al. |
| 5,617,351 A | 4/1997 | Bertin et al. |
| 5,630,905 A | 5/1997 | Lynch et al. |
| 5,659,187 A | 8/1997 | Legoues et al. ............ 257/190 |
| 5,683,934 A | 11/1997 | Candelaria .................. 437/134 |
| 5,698,869 A | 12/1997 | Yoshimi et al. |
| 5,714,777 A | 2/1998 | Ismail et al. |
| 5,728,623 A | 3/1998 | Mori |
| 5,739,567 A | 4/1998 | Wong |
| 5,759,898 A | 6/1998 | Ek et al. |
| 5,777,347 A | 7/1998 | Bartelink |
| 5,786,612 A | 7/1998 | Otani et al. |
| 5,786,614 A | 7/1998 | Chuang et al. |
| 5,792,679 A | 8/1998 | Nakato ....................... 438/162 |
| 5,808,344 A | 9/1998 | Ismail et al. |
| 5,821,577 A | 10/1998 | Crabbé et al. |
| 5,847,419 A | 12/1998 | Imai et al. |
| 5,863,830 A | 1/1999 | Bruel et al. |
| 5,877,070 A | 3/1999 | Goesele et al. |
| 5,882,987 A | 3/1999 | Srikrishnan |
| 5,891,769 A | 4/1999 | Liaw et al. ................. 438/167 |
| 5,906,708 A | 5/1999 | Robinson et al. |
| 5,906,951 A | 5/1999 | Chu et al. ................... 438/751 |
| 5,912,479 A | 6/1999 | Mori et al. |
| 5,943,560 A | 8/1999 | Chang et al. |
| 5,963,817 A | 10/1999 | Chu et al. |
| 5,966,622 A | 10/1999 | Levine et al. |
| 5,993,677 A | 11/1999 | Biasse et al. |
| 5,998,807 A | 12/1999 | Lustig et al. ................ 257/66 |
| 6,013,134 A | 1/2000 | Chu et al. ................... 118/715 |
| 6,013,563 A | 1/2000 | Henley et al. |
| 6,020,252 A | 2/2000 | Aspar et al. |
| 6,030,887 A | 2/2000 | Desai et al. ................ 438/507 |
| 6,033,974 A | 3/2000 | Henley et al. |
| 6,033,995 A | 3/2000 | Muller |
| 6,058,044 A | 5/2000 | Sugiura et al. |
| 6,059,895 A | 5/2000 | Chu et al. |
| 6,074,919 A | 6/2000 | Gardner et al. |
| 6,096,590 A | 8/2000 | Chan et al. ................. 438/233 |
| 6,103,559 A | 8/2000 | Gardner et al. |
| 6,103,597 A | 8/2000 | Aspar et al. |
| 6,103,599 A | 8/2000 | Henley et al. |
| 6,107,653 A | 8/2000 | Fitzgerald .................. 257/191 |
| 6,111,267 A | 8/2000 | Fischer et al. |
| 6,117,750 A | 9/2000 | Bensahel et al. |
| 6,130,453 A | 10/2000 | Mei et al. |
| 6,133,799 A | 10/2000 | Favors, Jr. et al. |
| 6,140,687 A | 10/2000 | Shimomura et al. |
| 6,143,636 A | 11/2000 | Forbes et al. |
| 6,153,495 A | 11/2000 | Kub et al. |
| 6,154,475 A | 11/2000 | Soref et al. |
| 6,160,303 A | 12/2000 | Fattaruso |
| 6,162,688 A | 12/2000 | Gardner et al. |
| 6,162,705 A | 12/2000 | Henley et al. |
| 6,184,111 B1 | 2/2001 | Henley et al. |
| 6,190,998 B1 | 2/2001 | Bruel et al. |
| 6,191,007 B1 | 2/2001 | Matsui et al. |
| 6,191,432 B1 | 2/2001 | Sugiyama et al. |
| 6,194,722 B1 | 2/2001 | Fiorini et al. |
| 6,204,529 B1 | 3/2001 | Lung et al. |
| 6,207,977 B1 | 3/2001 | Augusto ..................... 257/192 |
| 6,210,988 B1 | 4/2001 | Howe et al. |
| 6,218,677 B1 | 4/2001 | Broekaert |
| 6,225,192 B1 | 5/2001 | Aspar et al. |
| 6,232,138 B1 | 5/2001 | Fitzgerald et al. |
| 6,235,567 B1 | 5/2001 | Huang |
| 6,242,324 B1 | 6/2001 | Kub et al. ................... 438/455 |
| 6,249,022 B1 | 6/2001 | Lin et al. |
| 6,251,751 B1 | 6/2001 | Chu et al. |
| 6,251,755 B1 | 6/2001 | Furukawa et al. ........... 438/510 |
| 6,261,929 B1 | 7/2001 | Gehrke et al. |
| 6,266,278 B1 | 7/2001 | Harari et al. |
| 6,271,551 B1 | 8/2001 | Schmitz et al. |
| 6,290,804 B1 | 9/2001 | Henley et al. |
| 6,291,321 B1 | 9/2001 | Fitzgerald ................... 438/494 |
| 6,303,468 B1 | 10/2001 | Aspar et al. |
| 6,323,108 B1 | 11/2001 | Kub et al. |
| 6,326,667 B1 | 12/2001 | Sugiyama et al. |
| 6,329,063 B1 | 12/2001 | Lo et al. |
| 6,335,546 B1 | 1/2002 | Tsuda et al. |
| 6,339,232 B1 | 1/2002 | Takagi ....................... 257/192 |
| 6,344,417 B1 | 2/2002 | Usenko |
| 6,346,459 B1 | 2/2002 | Usenko et al. |
| 6,350,311 B1 | 2/2002 | Chin et al. |
| 6,350,993 B1 | 2/2002 | Chu et al. ..................... 257/19 |
| 6,352,909 B1 | 3/2002 | Usenko |
| 6,355,493 B1 | 3/2002 | Usenko |
| 6,368,733 B1 | 4/2002 | Nishinaga |
| 6,368,938 B1 | 4/2002 | Usenko |
| 6,369,438 B1 | 4/2002 | Sugiyama et al. |
| 6,372,356 B1 | 4/2002 | Thornton et al. |
| 6,372,593 B1 | 4/2002 | Hattori et al. |
| 6,372,609 B1 | 4/2002 | Aga et al. |
| 6,387,829 B1 | 5/2002 | Usenko et al. |
| 6,391,740 B1 | 5/2002 | Cheung et al. |
| 6,399,970 B1 | 6/2002 | Kubo et al. |
| 6,403,975 B1 | 6/2002 | Brunner et al. |
| 6,407,406 B1 | 6/2002 | Tezuka |
| 6,410,371 B1 | 6/2002 | Yu et al. |
| 6,425,951 B1 | 7/2002 | Chu et al. ..................... 117/3 |
| 6,429,061 B1 | 8/2002 | Rim |
| 6,445,016 B1 | 9/2002 | An et al. |
| 6,448,152 B1 | 9/2002 | Henley et al. |
| 6,455,397 B1 | 9/2002 | Belford |
| 6,458,672 B1 | 10/2002 | Henley et al. |
| 6,475,072 B1 | 11/2002 | Canaperi et al. |
| 6,489,639 B1 | 12/2002 | Hoke et al. |
| 6,514,836 B1 | 2/2003 | Belford |
| 6,515,335 B1 | 2/2003 | Christiansen et al. |
| 6,524,935 B1 | 2/2003 | Canaperi et al. |
| 6,534,381 B1 | 3/2003 | Cheung et al. |
| 6,555,839 B1 | 4/2003 | Fitzgerald et al. |
| 6,559,021 B1 * | 5/2003 | Houghton et al. ........... 438/312 |
| 6,573,126 B1 | 6/2003 | Cheng et al. |
| 6,583,015 B1 | 6/2003 | Fitzgerald et al. |
| 6,583,437 B1 | 6/2003 | Mizuno et al. |

| | | | | | | |
|---|---|---|---|---|---|---|
| 6,591,321 B1 | 7/2003 | Arimilli et al. | | 2003/0178681 A1 | 9/2003 | Clark et al. |
| 6,593,191 B1 | 7/2003 | Fitzgerald | | 2003/0189229 A1 | 10/2003 | Mouli |
| 6,593,625 B1 | 7/2003 | Mooney et al. | | 2003/0199126 A1 | 10/2003 | Chu et al. |
| 6,596,610 B1 | 7/2003 | Kuwabara et al. | | 2003/0201458 A1 | 10/2003 | Clark et al. |
| 6,597,016 B1 | 7/2003 | Yuki et al. | | 2003/0203600 A1 | 10/2003 | Chu et al. |
| 6,602,613 B1 | 8/2003 | Fitzgerald | | 2003/0207127 A1 | 11/2003 | Murthy et al. |
| 6,603,156 B1 | 8/2003 | Rim | | 2003/0215990 A1 | 11/2003 | Fitzgerald et al. |
| 6,607,948 B1 | 8/2003 | Sugiyama et al. | | 2003/0218189 A1 | 11/2003 | Christiansen et al. |
| 6,624,047 B1 | 9/2003 | Sakaguchi et al. | | 2003/0219957 A1 | 11/2003 | Kuwabara et al. |
| 6,624,478 B1 | 9/2003 | Anderson et al. | | 2003/0227036 A1 | 12/2003 | Sugiyama et al. |
| 6,632,724 B1 | 10/2003 | Henley et al. | | 2003/0227057 A1 | 12/2003 | Lochtefeld et al. |
| 6,635,909 B1 | 10/2003 | Clark et al. | | 2003/0230778 A1 | 12/2003 | Park et al. |
| 6,645,831 B1 | 11/2003 | Shaheen et al. | | 2003/0232467 A1 | 12/2003 | Anderson et al. |
| 6,646,322 B1 | 11/2003 | Fitzgerald | | 2004/0005740 A1 | 1/2004 | Lochtefeld et al. |
| 6,649,480 B1 | 11/2003 | Fitzgerald et al. | | 2004/0007724 A1 | 1/2004 | Murthy et al. |
| 6,649,492 B1 | 11/2003 | Chu et al. | | 2004/0009649 A1 | 1/2004 | Kub et al. |
| 6,656,271 B1 | 12/2003 | Yonehara et al. | | 2004/0012037 A1 | 1/2004 | Venkatesan et al. |
| 6,664,169 B1 | 12/2003 | Iwasaki et al. | | 2004/0012075 A1 | 1/2004 | Bedell et al. |
| 6,674,150 B1 | 1/2004 | Takagi et al. | | 2004/0014304 A1 | 1/2004 | Bhattacharyya |
| 6,677,183 B1 | 1/2004 | Sakaguchi et al. | | 2004/0018699 A1 | 1/2004 | Boyd et al. |
| 6,677,192 B1 | 1/2004 | Fitzgerald | | 2004/0031979 A1 | 2/2004 | Lochtefeld et al. |
| 6,680,240 B1 | 1/2004 | Maszara | | 2004/0031990 A1 | 2/2004 | Jin et al. |
| 6,680,260 B1 | 1/2004 | Akiyama et al. | | 2004/0041174 A1 | 3/2004 | Okihara |
| 6,690,043 B1 | 2/2004 | Usuda et al. | | 2004/0041210 A1 | 3/2004 | Mouli |
| 6,703,144 B1 | 3/2004 | Fitzgerald | | 2004/0048091 A1 | 3/2004 | Sato et al. |
| 6,703,688 B1 | 3/2004 | Fitzergald | | 2004/0048454 A1 | 3/2004 | Sakaguchi |
| 6,706,614 B1 | 3/2004 | An et al. | | 2004/0051140 A1 | 3/2004 | Bhattacharyya |
| 6,706,618 B1 | 3/2004 | Takisawa et al. | | 2004/0053477 A1 | 3/2004 | Ghyselen et al. |
| 6,707,106 B1 | 3/2004 | Wristers et al. | | 2004/0075149 A1 | 4/2004 | Fitzgerald et al. |
| 6,709,903 B1 | 3/2004 | Christiansen et al. | | 2004/0219726 A1 | 11/2004 | Fitzgerald |
| 6,709,909 B1 | 3/2004 | Mizuno et al. | | 2004/0262631 A1 | 12/2004 | Fitzgerald |
| 6,723,661 B1 | 4/2004 | Fitzergald | | 2005/0009288 A1 | 1/2005 | Fitzgerald |
| 6,724,008 B1 | 4/2004 | Fitzergald | | | | |
| 6,730,551 B1 | 5/2004 | Lee et al. | | FOREIGN PATENT DOCUMENTS | | |
| 6,737,670 B1 | 5/2004 | Cheng et al. | | | | |
| 6,750,130 B1 | 6/2004 | Fitzgerald | | EP | 0 514 018 A2 | 4/1992 |
| 6,770,134 B1 * | 8/2004 | Maydan et al. ............... 117/89 | | EP | 0 587 520 A1 | 3/1994 |
| 6,830,976 B1 | 12/2004 | Fitzgerald | | EP | 0 683 522 | 11/1995 .................... 27/92 |
| 6,881,632 B1 | 4/2005 | Fitzgerald et al. | | EP | 0 828 296 A2 | 3/1998 |
| 6,921,914 B1 | 7/2005 | Cheng et al. | | EP | 0 829 908 | 3/1998 |
| 2001/0003269 A1 | 6/2001 | Wu et al. | | EP | 0 838 858 | 4/1998 |
| 2001/0003364 A1 | 6/2001 | Sugawara et al. | | EP | 1 020 900 | 7/2000 |
| 2001/0007789 A1 | 7/2001 | Aspar et al. | | EP | 1 174 928 | 1/2002 |
| 2002/0014003 A1 | 2/2002 | Rim | | FR | 2 701 599 | 9/1993 |
| 2002/0024395 A1 | 2/2002 | Akatsuka et al. | | GB | 2 342 777 A | 4/2000 |
| 2002/0043660 A1 | 4/2002 | Yamazaki et al. | | JP | 61-141116 | 6/1986 |
| 2002/0052084 A1 | 5/2002 | Fitzgerald | | JP | 2-210816 | 8/1990 |
| 2002/0068393 A1 | 6/2002 | Fitzgerald et al. ........... 438/282 | | JP | 3-036717 | 2/1991 |
| 2002/0072130 A1 | 6/2002 | Cheng et al. | | JP | 4-307974 | 10/1992 |
| 2002/0084000 A1 | 7/2002 | Fitzgerald | | JP | 5-166724 | 7/1993 |
| 2002/0096717 A1 | 7/2002 | Chu et al. | | JP | 6-177046 | 6/1994 |
| 2002/0100942 A1 | 8/2002 | Fitzgerald et al. | | JP | 6-244112 | 9/1994 |
| 2002/0123167 A1 | 9/2002 | Fitzgerald | | JP | 6-252046 | 9/1994 |
| 2002/0123183 A1 | 9/2002 | Fitzgerald | | JP | 7-094420 | 4/1995 |
| 2002/0123197 A1 | 9/2002 | Fitzgerald et al. | | JP | 7-106446 | 4/1995 |
| 2002/0125471 A1 | 9/2002 | Fitzgerald et al. ............. 257/19 | | JP | 7-240372 | 9/1995 |
| 2002/0125497 A1 | 9/2002 | Fitzgerald | | JP | 10-270685 | 10/1998 |
| 2002/0140031 A1 | 10/2002 | Rim .......................... 257/347 | | JP | 11-233744 | 8/1999 |
| 2002/0168864 A1 | 11/2002 | Cheng et al. | | JP | 2000-031491 | 1/2000 |
| 2002/0197803 A1 | 12/2002 | Leitz et al. ................. 438/285 | | JP | 2000-021783 | 8/2000 |
| 2003/0003679 A1 | 1/2003 | Doyle et al. | | JP | 2001-319935 | 11/2001 |
| 2003/0013305 A1 | 1/2003 | Sugii et al. | | JP | 2002-076334 | 3/2002 |
| 2003/0013323 A1 | 1/2003 | Hammond et al. | | JP | 2002-164520 | 6/2002 |
| 2003/0025131 A1 | 2/2003 | Lee et al. | | JP | 2002-289533 | 10/2002 |
| 2003/0034529 A1 | 2/2003 | Fitzgerald et al. | | WO | 98/59365 | 12/1998 .................... 21/20 |
| 2003/0057439 A1 | 3/2003 | Fitzgerald | | WO | 99/53539 | 10/1999 |
| 2003/0080361 A1 | 5/2003 | Murthy et al. | | WO | 00/48239 | 8/2000 |
| 2003/0102498 A1 | 6/2003 | Braithwaite et al. | | WO | 00/54338 | 9/2000 .................... 29/778 |
| 2003/0119280 A1 | 6/2003 | Lee et al. | | WO | 01/22482 A1 | 3/2001 .................... 21/20 |
| 2003/0127646 A1 | 7/2003 | Christiansen et al. | | WO | WO 01/022482 A1 | 3/2001 |
| 2003/0139000 A1 * | 7/2003 | Bedell et al. ............... 438/186 | | WO | 01/54202 | 7/2001 .................... 29/10 |
| 2003/0157787 A1 | 8/2003 | Murthy et al. | | WO | 01/93338 | 12/2001 .................... 29/778 |
| 2003/0160300 A1 | 8/2003 | Takenaka et al. | | WO | 01/99169 A2 | 12/2001 .................... 21/306 |

| | | | | |
|---|---|---|---|---|
| WO | 02/13262 | 2/2002 | | 23/0 |
| WO | 02/15244 A2 | 2/2002 | | |
| WO | 02/27783 A1 | 4/2002 | | |
| WO | 02/47168 | 6/2002 | | |
| WO | 02/071488 A1 | 9/2002 | | |
| WO | 02/071491 A1 | 9/2002 | | |
| WO | 02/071495 A1 | 9/2002 | | |
| WO | 02/082514 A1 | 10/2002 | | |

OTHER PUBLICATIONS

Armstrong, "Technology for SiGe Heterostructure-Based CMOS Devices", PhD Thesis, Massachusetts Institute of Technology, 1999, pp. 1-154.

Augusto et al., "Proposal for a New Process Flow for the Fabrication of Silicon-based Complementary MOD-MOSFETs without ion Implantation," Thin Solid Films, vol. 294, No. 1-2, pp. 254-258 (Feb. 15, 1997).

Currie, M.T.; "SiGe Virtual Substrate Engineering for Integration of III-V Materials, Microelectromechanical Systems, and Strained Silicon MOSFET's with Silicon," Dept. of Materials Science and Engineering in Partial Fulfillment of the Requirements for the Degree of Doctor of Philosophy in Electronic Materials at the Massachusetts Institute of Technology, Feb. 2001, pp. 158-162, 170-183.

Currie et al., "Controlling Threading Dislocation in Ge on Si Using Graded SiGe Layers and Chemical-Mechanical Polishing," vol. 72 No. 14, p. 1718-1720, Feb. 1998.

Hackbarth et al., "Alternatives to thick MBE-grown relaxed SiGe buffers," Thin Solid Films, vol. 369, No. 1-2 (Jul. 2000) pp. 148-151.

Herzog et al., "SiGe-based FETs: buffer issues and device results," Thin Solid FIlms, vol. 380 (2000) pp. 36-41.

International Technology Roadmap for Semiconductors (2001) pp. 1-44.

Ismail, "Si/SiGe High-Speed Field-Effect Transistors," Electron Devices Meeting, Washington, D.C. (Dec. 10, 1995) pp. 20.1.1-20.1.4.

König et al., "Design Rules for n-Type SiGe Hetero FETs," Solid State Electronics, vol. 41, No. 10 (1997), pp. 1541-1547.

Kuznetsov et al., "Technology for high-performance n-channel SiGe modulation-doped field-effect transistors," J. Vac. Sci.Technol., B 13(6), pp. 2892-2896 (Nov./Dec. 1995).

Maiti et al., "Strained-Si heterostructure field effect transistors," Semicond. Sci. Technol., vol. 13 (1998) pp. 1225-1246.

Monroe, D. et al..; "Comparison of mobility-limiting mechanisms in high-mobility $Si_{1-x}Ge_x$ heterostructures," J. Vac. Sci. Technol. B 11(4), Jul./Aug. 1993, pp. 1731-1737.

Parker et al., "SiGe heterostructure CMOS circuits and applications," Solid State Electronics, vol. 43 (1999) pp. 1497-1506.

Rim et al., "Fabrication and Analysis of Deep Submicron Strained-Si N-MOSFET's"; IEEE Transactions on Electron Devices, vol. 47, No. 7, Jul. 2000, pp. 1406-1415.

Sadek e tal., "Design of Si/SiGe Heterojunction Complementary Metal-Oxide-Semiconductor Transistors," IEEE Trans. Electron Devices (Aug. 1996) pp. 1224-1232.

Welser, "The Application of Strained Silicon/Relaxed Silicon Germanium Heterostructures to Metal-Oxide-Semiconductor Field-Effect Transistors," PhD Thesis, Stanford University, 1994, pp. 1-205.

Currie, M.T. et al., "Carrier mobilities and process stability of strained Si n- and p-MOSFETs on SiGe virtual substrates," J. Vac. Sci. Technol. B 19(6) Nov./Dec. 2001, pp. 2268-2279.

Cheng, Z.Y. et al., "Electron Mobility Enhancement in Strained-Si n-MOSFETs Fabricated on SiGe-on-Insulator (SGOI) Substrates," IEEE Electron Device Letters, vol. 22, No. 7, Jul. 2001, pp. 321-323.

Hock, G. et al., "High hole mobility in $Si_{0.17}Ge_{0.83}$ channel metal-oxide-semiconductor field-effect transistors grown by plasma-enhanced chemical vapor deposition" Applied Physics Letters, vol. 76, No. 26, Jun. 26, 2000, pp. 3920-3922.

Kummer, M. et al., "Low energy plasma enhanced chemical vapor deposition," Materials Science and Engineering B89 (2002) pp. 288-295.

Leitz, C.W. et al., "Hole mobility enhancements in strained $Si/Si_{1-y}Ge_y$ p-type metal-oxide-semiconductor field-effect transistors grown on relaxed $Si_{1-x}Ge_x$ (x<y) virtual substrates," Applied Physics Letters, vol. 79, No. 25, Dec. 17, 2001, pp. 4246-4248.

Lee, M.L. et al., "Strained Ge channel p-type metal-oxide-semiconductor field-effect transistors grown on $Si_{1-x}Ge_x$/virtual substrates" Applied Physics Letters, vol. 79, No. 20, Nov. 12, 2001, pp. 3344-3346.

Maiti, C.K. et al., "Strained-Si heterostructure field effect transistors," Semicond. Sci. Technol. 13(1998) pp. 1225-1246.

Rosenblad, C. et al., "A plasma process for ultrafast deposition of SiGe graded buffer layers," Applied Physics Letters, vol. 76, No. 4, Jan. 24, 2000, pp. 427-429.

Sawano, K. et al., "Surface smoothing of SiGe strain-relaxed buffer layers by chemical mechanical polishing," Materials Science and Engineering B89 (2002) pp. 406-409.

Sugii, N., "Thermal stability of the strained-$Si/Si_{0.7}Ge_{0.3}$ heterostructure," Journal of Applied Physics vol. 89, No. 11, Jun. 1, 2001, pp. 6459-6463.

Tan, C.S. et al., "$N_2O$ oxidation of strained-Si/relaxed-SiGe heterostructure grown by UHVCVD," Solid-State Electronics 45 (2001) pp. 1945-1949.

Taraschi, G. et al., "Relaxed SiGe-on-insulator fabricated via wafer bonding and etch back," J. Vac. Sci. Technol. B 20(2) Mar./Apr. 2002, pp. 725-727.

PCT International Search Report, PCT/US 03/18135 (7 pgs.).

Armstrong et al., "Design of Si/SiGe Heterojunction Complementary Metal-Oxide-Semiconductor Transistors," IEDM Technical Digest (1995 International Electron Devices Meeting) pp. 761-764.

Barradas et al., "RBS analysis of MBE-grown SiGe/(001) Si heterostructures with thin, high Ge content SiGe channels for HMOS transistors," Modern Physcis Letters B (2001) (abstract).

Borenstein et al., "A New Ultra-Hard Etch-Stop Layer for High Precision Micromachining," Proceedings of the 1999 12th IEEE International Conference on Micro Electro Mechanical Systems (MEMs) (Jan. 17-21, 1999) pp. 205-210.

Bouillon et al., "Search for the optimal channel architecture for 0.18/0.12 μm bulk CMOS Experimental study," IEEE, (1996) pp. 21.2.1-21.2.4.

Bruel et al., "® SMART CUT: A Promising New SOI Material Technology," Proceedings 1995 IEEE International SOI Conference (Oct. 1995) pp. 178-179.

Bruel, "Silicon on Insulator Material Technology," Electronic Letters, vol. 13, No. 14 (Jul. 6, 1995) pp. 1201-1202.

Bufler et al., "Hole transport in strained Si1-xGex alloys on Si1-yGey substrates," Journal of Applied Physics, vol. 84, No. 10 (Nov. 15, 1998) pp. 5597-5602.

Burghartz et al., "Microwave Inductors and Capacitors in Standard Multilevel Interconnect Silicon Technology", IEEE Transactions on Microwave Theory and Techniques, vol. 44, No. 1, Jan. 1996, pp. 100-104.

Canaperi et al., "Preparation of a relaxed Si-Ge layer on an insulator in fabricating high-speed semiconductor devices with strained epitaxial films,"International Business Machines Corporation, USA (2002) (abstract).

Carlin et al., "High Efficiency GaAs-on-Si Solar Cells with High Voc Using Graded GeSi Buffers," IEEE (2000) pp. 1006-1011.

Chang et al., "Selective Etching of SiGe/Si Heterostructures," Journal of the Electrochemical Society, No. 1 (Jan. 1991) pp. 202-204.

Cheng et al., "Relaxed Silicon-Germanium on Insulator Substrate by Layer Transfer," Journal of Electronic Materials, vol. 30, No. 12 (2001) pp. L37-L39.

Cullis et al, "Growth ripples upon strained SiGe epitaxial layers on Si and misfit dislocation interactions," Journal of Vacuum Science and Technology A, vol. 12, No. 4 (Jul./Aug. 1994) pp. 1924-1931.

Eaglesham et al., "Dislocation-Free Stranski-Krastanow Growth of Ge on Si(100)," Physical Review Letters, vol. 64, No. 16 (Apr. 16, 1990) pp. 1943-1946.

Feijoo et al., "Epitaxial Si-Ge Etch Stop Layers with Ethylene Diamine Pyrocatechol for Bonded and Etchback Silicon-on-Insulator," Journal of Electronic Materials, vol. 23, No. 6 (Jun. 1994) pp. 493-496.

Fischetti et al., "Band structure, deformation potentials, and carrier mobility in strained Si, Ge, and SiGe alloys," J. Appl. Phys., vol. 80, No. 4 (Aug 15, 1996) pp. 2234-2252.

Fischetti, "Long-range Coulomb interactions in small Si devices. Part II. Effective electronmobility in thin-oxide structures," Journal of Applied Physics, vol. 89, No. 2 (Jan. 15, 2001) pp. 1232-1250.

Fitzgerald et al., "Dislocation dynamics in relaxed graded composition semiconductors," Materials Science and Engineering B67, (1999) pp. 53-61.

Fitzgerald et al., "Relaxed GexSi1-x structures for III-V integration with Si and high mobility two-dimensional electron gases in Si," AT&T Bell Laboratories, Murray Hill, NJ 07974 (1992) American Vacuum Society, pp. 1807-1819.

Fitzgerald et al., "Totally Relaxed GexSi1-x Layers with Low Threading Dislocation Densities Grown on Si Substrates," Applied Physics Letters, vol. 59, No. 7 (Aug. 12, 1991) pp. 811-813.

Garone et al., "Silicon vapor phase epitaxial growth catalysis by the presence of germane," Applied Physics Letters, vol. 56, No. 13 (Mar. 26, 1990) pp. 1275-1277.

Gray and Meyer, "Analysis and Design of Analog Integrated Circuits", John Wiley & Sons, 1984, pp. 605-632.

Grützmacher et al., "Ge segregation in SiGe/Si heterostructures and its dependence on deposition technique and growth atmosphere," Applied Physics Letters, vol. 63, No. 18 (Nov. 1, 1993) pp. 2531-2533.

Hackbarth et al., "Strain relieved SiGe buffers for Si-based heterostructure field-effect transistors," Journal of Crystal Growth, vol. 201/202 (1999) pp. 734-738.

Höck et al., "Carrier mobilities in modulation doped Si1-xGex heterostructures with respect to FET applications," Thin Solid Films, vol. 336 (1998) pp. 141-144.

Höck et al., "High performance 0.25 μm p-type Ge/SiGe MODFETs," Electronics Letters, vol. 34, No. 19 (Sep. 17, 1998) pp. 1888-1889.

Huang et al., "High-quality strain-relaxed SiGe alloy grown on implanted silicon-on-insulator substrate," Applied Physics Letters, vol. 76, No. 19 (May 8, 2000) pp. 2680-2682.

Huang et al., "The Impact of Scaling Down to Deep Submicron on CMOS RF Circuits", IEEE Journal of Solid-State Circuits, vol. 33, No. 7, Jul., 1998, pp. 1023-1036.

IBM Technical Disclosure Bulletin, vol. 35, No. 4B (Sep. 1992), "2 Bit/Cell EEPROM Cell Using Band to Band Tunneling for Data Read-Out," pp. 136-140.

IBM Technical Disclosure Bulletin, vol. 32, No. 8A, Jan. 1990, "Optimal Growth Technique and Structure for Strain Relaxation of Si-Ge Layers on Si Substrates", pp. 330-331.

International Search Report for Int'l Application No. PCT/US01/46322, mailed Jan. 22, 2003 (ASC-043).

Ishikawa et al., "Creation of Si-Ge-based SIMOX structures by low energy oxygen implantation," Proceedings 1997 IEEE International SOI Conference (Oct. 1997) pp. 16-17.

Ishikawa et al., "SiGe-on-insulator substrate using SiGe alloy grown Si(001)," Applied Physics Letters, vol. 75, No. 7 (Aug. 16, 1999) pp. 983-985.

Ismail et al., "Modulation-doped n-type Si/SiGe with inverted interface," Appl. Phys. Lett., vol. 65, No. 10 (Sep. 5, 1994) pp. 1248-1250.

Kearney et al., "The effect of alloy scattering on the mobility of holes in a Si1-xGex quantum well," Semicond. Sci Technol., vol. 13 (1998) pp. 174-180.

Kim et al., "A Fully Integrated 1.9-GHz CMOS Low-Noise Amplifier", IEEE Microwave and Guided Wave Letters, vol. 8, No. 8, Aug. 1998, pp. 293-295.

Koester et al., "Extremely High Transconductance Ge/Si0.4Ge0.6 p-MODFET's Grown by UHV-CVD," IEEE Electron Device Letters, vol. 21, No. 3 (Mar. 2000) pp. 110-112.

König et al., "p-Type Ge-Channel MODFET's with High Transconductance Grown on Si Substrates," IEEE Electron Device Letters, vol. 14, No. 4 (Apr. 1993) pp. 205-207.

König et al., "SiGe HBTs and HFETs," Solid-State Electronics, vol. 38, No. 9 (1995) pp. 1595-1602.

Larson, "Integrated Circuit Technology Options for RFIC's □Present Status and Future Directions", IEEE Journal of Solid-State Circuits, vol. 33, No. 3, Mar. 1998, pp. 387-399.

Lee et al., "Strained Ge channel p-type MOSFETs fabricated on Si1-xGex/Si virtual substrates," Mat. Res. Soc. Symp. Proc., vol. 686 (2002) pp. A1.9.1-A1.9.5.

Lee et a., "CMOS RF Integrated Circuits at 5 GHz and Beyond", Proceedings of the IEEE, vol. 88, No. 10, Oct. 2000, pp. 1560-1571.

Leitz et al., "Channel Engineering of SiGe-Based Heterostructures for High Mobility MOSFETs," Mat. Res. Soc. Symp. Proc., vol. 686 (2002) pp. A3.10.1-A3.10.6.

Leitz et al., "Dislocation glide and blocking kinetics in compositionally graded SiGe/Si," Journal of Applied Physics, vol. 90, No. 6 (Sep. 15, 2001) pp. 2730-2736.

Li et al., "Design of high speed Si/SiGe heterojunction complementary metal-oxide-semiconductor field effect transistors with reduced short-channel effects," J. Vac. Sci. Technol., A vol. 20 No. 3 (May/Jun. 2002) pp. 1030-1033.

Lu et al., "High Performance 0.1 □m Gate-Length P-Type SiGe MODFET's and MOS-MODFET's", IEEE Transactions on Electron Devices, vol. 47, No. 8, Aug. 2000, pp. 1645-1652.

Maszara, "Silicon-On-Insulator by Wafer Bonding: A Review," Journal of the Electrochemical Society, No. 1 (Jan. 1991) pp. 341-347.

Meyerson et al., "Cooperative Growth Phenomena in Silicon/Germanium Low-Temperature Epitaxy," Applied Physics Letters, vol. 53 No. 25 (Dec. 19, 1988) pp. 2555-2557.

Mizuno et al., "Advanced SOI-MOSFETs with Strained-SI Channel for High Speed CMOS-Electron/Hole Mobility Enhancement," 2002 Symposium on VLSI Technology, Digest of Technical Papers, Honolulu, (Jun. 13-15), IEEE New York, NY, pp. 210-211.

Mizuno et al., "Electron and Hold Mobility Enhancement in Strained-Si MOSFET's on SiGe-on-Insulator Substrates Fabricated by SIMOX Technology," IEEE Electron Device Letters, vol. 21, No. 5 (May 2000) pp. 230-232.

Mizuno et al., "High Performance Strained-Si p-MOSFETs on SiGe-on-Insulator Substrates Fabricated by SIMOX Technology," IEEE IDEM Technical Digest, (1999 Internatioanl Electron Device Meeting) pp. 934-936.

Nayak et al., "High-Mobility Strained-Si PMOSFET's"; IEEE Transactions on Electron Devices, vol. 43, No. 10, Oct. 1996, pp. 1709-1716.

O'Neill et al., "SiGe Virtual substrate N-channel heterojunction MOSFETS," Semicond. Sci. Technol., vol. 14 (1999) pp. 784-789.

Papananos, "Radio-Frequency Microelectronic Circuits for Telecommunication Applications", Kluwer Academic Publishers, 1999, pp. 115-117, 188-193.

Ransom et al., "Gate-Self-Aligned n-channel and p-channel Germanium MOSFET's," IEEE Transactions on Electron Devices, vol. 38, No. 12 (Dec. 1991) pp. 2695.

Reinking et al., "Fabrication of high-mobility Ge p-channel MOSFETs on Si substrates," Electronics Letters, vol. 35, No. 6 (Mar. 18, 1999) pp. 503-504.

Rim et al., "Enhanced Hole Mobilities in Surface-channel Strained-Si p-MOSFETs"; IEDM, 1995, pp. 517-520.

Rim, "Application of Silicon-Based Heterostructures to Enhanced Mobility Metal-Oxide-Semiconductor Field-Effect Transistors", PhD Thesis, Stanford University, 1999; pp. 1-184.

Robbins et al., "A model for heterogeneous growth of Si1-xGex films for hydrides," Journal of Applied Physics, vol. 69, No. 6 (Mar. 15, 1991) pp. 3729-3732.

Schäffler, "High-Mobility Si and Ge Structures," Semiconductor Science and Technology, vol. 12 (1997) pp. 1515-1549.

Sugimoto and Ueno, "A 2V, 500 MHz and 3V, 920 MHz Low-Power Current-Mode 0.6 ▢m CMOS VCO Circuit", IEICE Trans. Electron., vol. E82-C, No. 7, Jul. 1999, pp. 1327-1329.

Tement et al., "Metal Gate Strained Silicon MOSFETs for Microwave Integrated Circuits", IEEE Oct. 2000, pp. 38-43.

Tweet et al., "Factors determining the composition of strained GeSi layers grown with disilane and germane," Applied Physics Letters, vol. 65, No. 20 (Nov. 14, 1994) pp. 2579-2581.

Usami et al., "Spectroscopic study of Si-based quantum wells with neighboring confinement structure," Semicon. Sci. Technol. (1997) (abstract).

Welser et al., "Electron Mobility Enhancement in Strained-Si N-Type Metal-Oxide-Semiconductor Field-Effect Transistors," IEEE Electron Device Letters, vol. 15, No. 3 (Mar. 1994) pp. 100-102.

Welser et al., "Evidence of Real-Space Hot-Electron Transfer in High Mobility, Strained-Si Multilayer MOSFETs," IEEE IDEM Technical Digest (1993 International Electron Devices Meeting) pp. 545-548.

Welser et al., "NMOS and PMOS Transistors Fabricated in Strained Silicon/Relaxed Silicon-Germanium Structures," IEEE IDEM Technical Digest (1992 International Electron Devices Meeting) pp. 1000-1002.

Wolf and Tauber, Silicon Processing for the VLSI Era, vol. 1: Process Technology, Lattice Press, Sunset Beach, CA, pp. 384-386 (1986).

Xie et al., "Semiconductor Surface Roughness: Dependence on Sign and Magnitude of Bulk Strain," The Physical Review Letters, vol. 73, No. 22 (Nov. 28, 1994) pp. 3006-3009.

Xie et al., "Very high mobility two-dimensional hole gas in Si/ GexSi1-x/Ge structures grown by molecular beam epitaxy," Appl. Phys. Lett., vol. 63, No. 16 (Oct. 18, 1993) pp. 2263-2264.

Xie, "SiGe Field effect transistors," Materials Science and Engineering, vol. 25 (1999) pp. 89-121.

Yeo et al., "Nanoscale Ultra-Thin-Body Silicon-on-Insulator P-MOSFET with a SiGe/Si Heterostructure Channel," IEEE Electron Device Letters, vol. 21, No. 4 (Apr. 2000) pp. 161-163.

Zhang et al., "Demonstration of a GaAs-Based Compliant Substrate Using Wafer Bonding and Substrate Removal Techniques," Electronic Materials and Processing Research Laboratory, Department of Electrical Engineering, University Park, PA 16802 (1998) pp. 25-28.

* cited by examiner

METHODS FOR FABRICATING STRAINED LAYERS ON SEMICONDUCTOR SUBSTRATES

CROSS-REFERENCE TO RELATED APPLICATION

This application claims priority to and the benefit of, and incorporates herein by reference, in its entirety, provisional U.S. patent application Ser. No. 60/364,733, filed Mar. 14, 2002.

FIELD OF THE INVENTION

The present invention relates generally to semiconductor fabrication methods and, more specifically, to methods for fabricating semiconductor structures having strained layers and controlled impurity diffusion gradients.

BACKGROUND OF THE INVENTION

The increasing operating speeds and computing power of microelectronic devices have given rise to the need for an increase in the complexity and functionality of the semiconductor substrates that are used as the starting substrate in these microelectronic devices. Historically, to maintain low fabrication cost, these semiconductors were built using silicon (Si) substrates. Nevertheless, with increasing speed and functionality requirements, Si substrates become limiting and designers need to use alternative materials that provide improved performance.

Potential alternatives include substrates made from materials such as germanium (Ge), gallium arsenide (GaAs), indium phosphide (InP), or gallium nitride (GaN). These alternate materials permit the development of a substrate suitable for a wider range of device types, functionalities, and speed. For example, new technological developments provide the ability to form heterostructures using silicon germanium (SiGe) to further speed up devices by changing the atomic structure of Si to increase electron mobility. These substrates are called strained Si substrates.

A strained Si substrate is generally formed by a first epitaxial growth of a relaxed SiGe layer on bulk Si, and then a second epitaxial growth of a thin (less than about 500 Angstroms) Si layer on the relaxed SiGe layer. Because the lattice constant of relaxed SiGe is different from Si, the thin Si layer becomes "strained," resulting in enhanced mobilities (and hence improved device speeds) over bulk Si. The percentage of Ge in SiGe, and the method of deposition can have a dramatic effect on the characteristics of the strained Si layer. U.S. Pat. No. 5,442,205, "Semiconductor Heterostructure Devices with Strained Semiconductor Layers," incorporated herein by reference, demonstrates one such method of producing a strained Si device structure.

A method of epitaxially growing a relaxed SiGe layer on bulk Si is discussed in PCT application WO 01/22482, "Method of Producing Relaxed Silicon Germanium Layers," incorporated herein by reference. The method includes providing a monocrystalline Si substrate, and then epitaxially growing a graded $Si_{1-x}Ge_x$ layer with increasing Ge concentration at a gradient of less than 25% Ge per micron to a final composition in the range of $0.1 \leq x \leq 1$, using a source gas of $Ge_xH_yCl_z$ for the Ge component, on the Si substrate at a temperature in excess of 850° C., and then epitaxially growing a semiconductor material on the graded layer. (The terms "SiGe" and "$Si_{1-x}Ge_x$" are used interchangeably to refer to silicon-germanium alloys.)

Another method of epitaxially growing a relaxed SiGe layer on bulk Si is discussed in a paper entitled, "Low Energy plasma enhanced chemical vapor deposition," by M. Kummer et. al. (Mat. Sci. & Eng. B89, 2002, pp. 288–95), incorporated herein by reference, in which a method of low-energy plasma-enhanced chemical vapor deposition (LEPECVD) is shown, which allows the formation of a SiGe layer on bulk Si at high growth rates (0.6 micron per minute) and low temperatures (500–750° C.).

SiGe graded layers with low threading dislocation densities (i.e., two-dimensional defects in a single crystal material) are usually thick layers (greater than 1000 Angstroms and often greater than one micron). Consequently, the industry is moving toward chemical vapor deposition (CVD) techniques that allow high growth rates. Nevertheless, to grow a thin (less than 500 Angstroms thick), epitaxial strained Si layer uniformly on the SiGe, a high growth rate process is not optimal. To maintain a high-quality strained Si layer without defects, a low-growth rate, low-temperature (LT) CVD process is preferred. In other words, for developing strained Si substrates, the optimal epitaxial growth process of the first thick SiGe layer on bulk Si is different from the optimal epitaxial growth process of the second thin Si layer.

To grow a high-quality, thin, epitaxial strained Si layer on a graded SiGe layer, the SiGe layer is, ideally, planarized to reduce the surface roughness in the final strained Si substrate. Current methods of chemical mechanical polishing (CMP) are typically used to improve the planarity of surfaces in semiconductor fabrication processes. U.S. Pat. No. 6,107,653, "Controlling Threading Dislocations in Ge on Si Using Graded GeSi Layers and Planarization," incorporated herein by reference, describes how planarization can be used to improve the quality of SiGe graded layers.

Integrating the development process of strained Si substrates with existing Si-based tools minimizes the re-tooling of fabrication plants. Nevertheless, existing Si fabrication tools generally do not support the process control differences required for the epitaxial growth of the first thick SiGe layer and the second thin Si layer sequentially in the same CVD step. Additionally, a planarization step may be inserted between the thick SiGe layer deposition and the thin Si layer deposition to ensure that the resulting substrate has good surface morphology.

One challenge to the manufacturability of semiconductor devices that include strained layers is that one or more high temperature processing steps are typically employed after the addition of the strained material. This can cause intermixing of the strained layer and adjacent material. This intermixing is generally referred to as interdiffusion, and it can be described by well-known diffusion theory (e.g., Fick's laws). One example of interdiffusion is found in a field effect transistor ("FET") where a strained layer is used as the channel. In this example, one or more impurities (e.g., dopants) are implanted after addition of the strained layer. If implantation is followed by a moderately high temperature step (e.g., a drive-in or anneal step), there can be rampant interdiffusion of the channel by the implant impurity due to the presence of implant damage and excess point defects in the strained layer. A result is that the impurity is present in the strained layer. Stated differently, the impurity profile (i.e., a gradient describing the impurity concentration as a function of location in the overall semiconductor or device) has a non-zero value in the strained layer. Presence of one or more impurities in the strained layer can, at certain concentrations, degrade overall device performance.

From the foregoing, it is apparent that there is still a need for a way to produce semiconductor structures by rapidly growing a thick SiGe layer followed by growing a thin, high-quality, strained Si layer. Further, it is desirable to accomplish this with a process tool that integrates the fabrication steps and allows for planarizing the SiGe layer. It is advantageous for the resulting structures to exhibit minimal incursion of one or more impurity species into the strained layer.

SUMMARY OF THE INVENTION

The present invention provides methods for fabricating semiconductor structures that include several growth steps, each step being optimized for the particular semiconductor layer to be grown. For processing efficiency, the fabrication steps may be integrated into a single tool or a minimum number of tools. One or more strained material layers that are grown are relatively free of interdiffused impurities. Consequently, semiconductor devices built using the structures described herein do not exhibit the degraded performance that results from the presence of such impurities in the strained layers.

The invention features a method for fabricating a semiconductor structure on a substrate. The method includes the step of exposing the substrate to a first gas mixture at a temperature greater than about 500° C. This results in rapid growth of one or more layers of SiGe having a thickness greater than about 1000 Angstroms. Following this, the SiGe is planarized and the substrate is exposed to a second gas mixture at a temperature less than or equal to about 750° C. This results in the growth of one or more strained layers having a thickness less than about 500 Angstroms. Both the first and second gas mixtures typically include Si, or Ge, or both.

In certain embodiments, the semiconductor substrate can include Si, SiGe, or any combination of these materials. It can also be multi-layered. In this latter case, the layers can include relaxed SiGe disposed on compositionally graded SiGe. The layers can also include relaxed SiGe disposed on Si. One or more buried insulating layers may be included as well.

In other embodiments, the grown SiGe layer(s) may be substantially relaxed or compositionally graded. Further, the strained layer can include Si, Ge, SiGe, or any combination of these materials. At least about fifty Angstroms of the furthest part of the strained layer defines a distal zone where the concentration of impurities is substantially equal to zero. Some embodiments include a subsequent SiGe layer deposited on the strained layer.

An alternative embodiment includes fabricating a semiconductor structure on a substrate having one or more preexisting material layers with a thickness greater than about 200 Angstroms. This method involves exposing the substrate to a gas mixture that includes Si, or Ge, or both, at a temperature less than or equal to about 750° C. This results in the growth of one or more strained layers having a thickness less than about 500 Angstroms. In some embodiments, the preexisting material layers may include SiGe, an insulating layer, or both.

Other aspects and advantages of the present invention will become apparent from the following detailed description, taken in conjunction with the accompanying drawings, illustrating the principles of the invention by way of example only.

BRIEF DESCRIPTION OF THE DRAWINGS

The foregoing and other objects, features, and advantages of the present invention, as well as the invention itself, will be more fully understood from the following description of various embodiments, when read together with the accompanying drawings, in which.

DETAILED DESCRIPTION

As shown in the drawings for the purposes of illustration, the invention may be embodied in a fabrication method for a semiconductor structure or device, such as, for example, a FET, having specific structural features. A semiconductor structure fabricated according to the invention includes multiple layers grown under conditions optimized for each layer. These layers can be Si or SiGe, and may be strained or relaxed. Further, the strained material layers are relatively free of interdiffused impurities. Stated differently, these strained material layers are characterized by at least one diffusion impurity gradient that has a value that is substantially equal to zero in a particular area of the strained layer. Consequently, the semiconductor structure does not exhibit the degraded performance that results from the presence of such impurities in certain parts of the strained layers.

Figure 1:
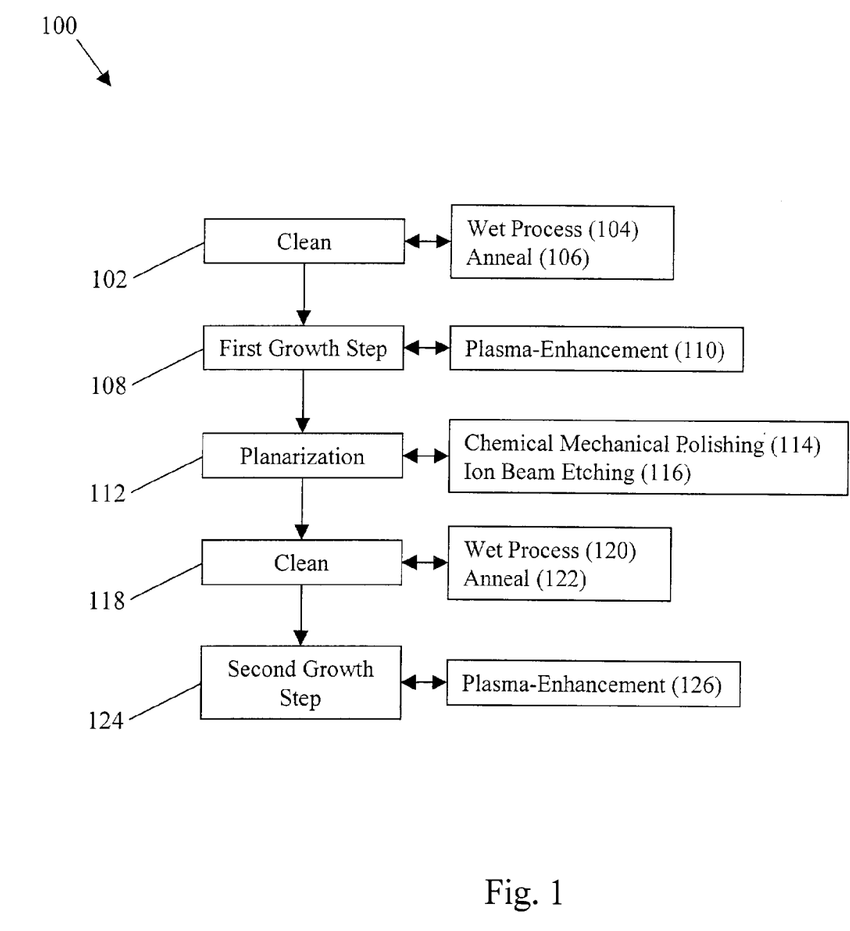
FIG. 1 is a flowchart depicting the steps of fabricating a semiconductor structure in accordance with an embodiment of the invention.

In brief overview, FIG. 1 depicts a method 100 for fabricating a semiconductor structure on a substrate in accordance with an embodiment of the invention. The substrate may be Si, SiGe, or other compounds such as, for example, GaAs or InP. The substrate may also include multiple layers, typically of different materials. For example, the multiple layers can include relaxed SiGe disposed on compositionally graded SiGe, as well as relaxed SiGe disposed on Si. The multiple layers may also include a buried insulating layer, such as $SiO_2$ or $Si_3N_4$. The buried insulating layer may also be doped.

This method shown in FIG. 1 includes a first growth step 108 where the substrate is exposed to a gas mixture at a temperature greater than about 500° C. In one embodiment, the temperature can be greater than about 850° C. In other embodiments this exposure occurs at a pressure less than or equal to about 760 Torr (absolute). The gas mixture typically includes Si, or Ge, or both. Some example gas mixtures are $SiH_4$—$GeH_4$, $SiH_2Cl_2$—$GeCl_4$, $SiH_2Cl_2$—$GeH_4$, $SiHCl_3$—$GeCl_4$, and $SiHCl_3$—$GeH_4$.

Figure 2:
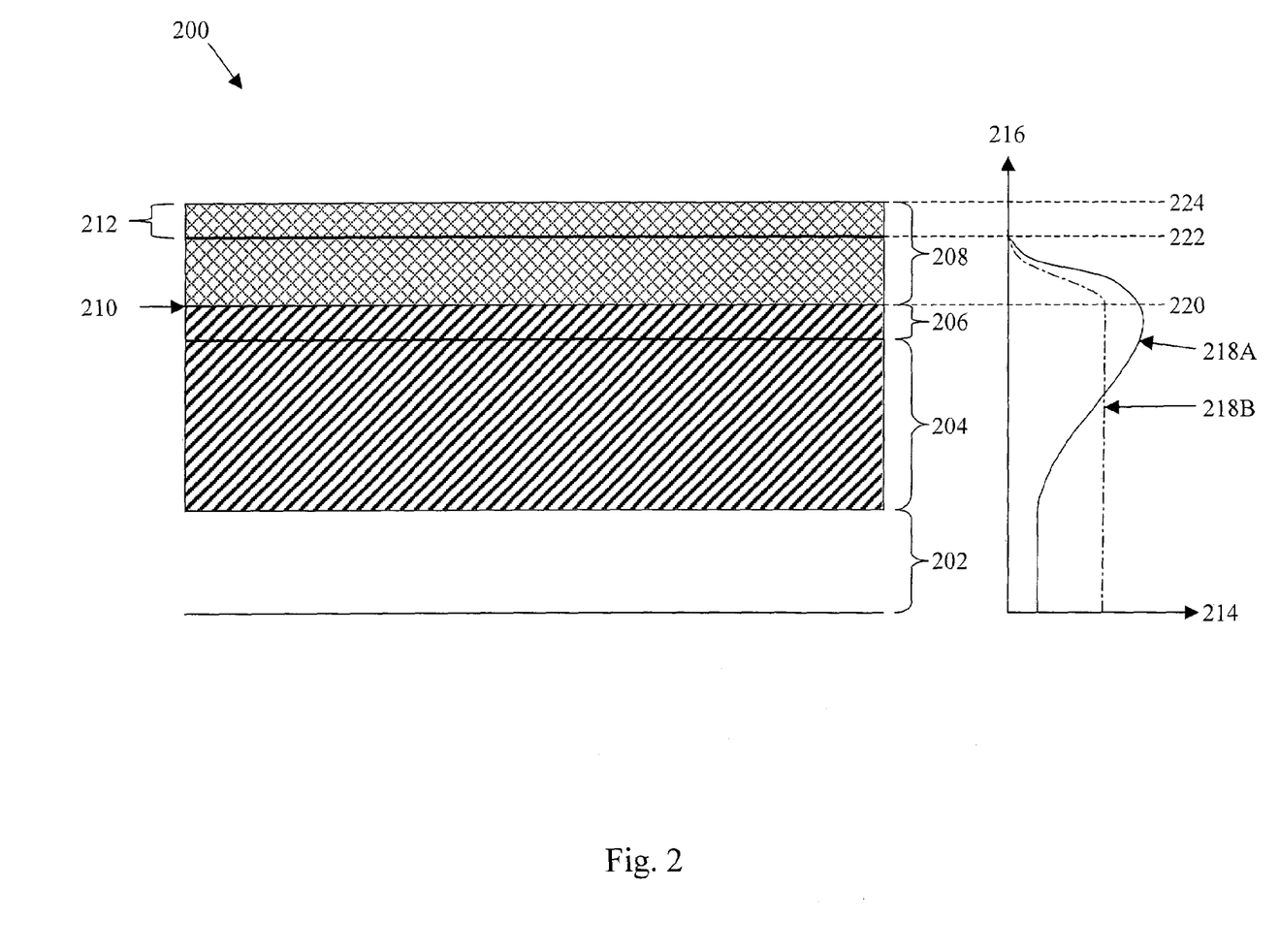
FIG. 2 is a schematic (unscaled) cross-sectional view that depicts a semiconductor structure in accordance with an embodiment of the invention.

Using one or more of these gas mixtures, one or more layers of SiGe 204 are grown on a substrate 202, as depicted in FIG. 2, which illustrates an example semiconductor structure 200. In one embodiment, the growth rate of the SiGe can be greater than about 0.2 micron per minute, and the resulting thickness can be greater than about 1000 Angstroms or even greater than about one micron. Further, the SiGe can be substantially relaxed. It can also be compositionally graded (e.g., ten percent Ge per micron of thickness). Some embodiments include multiple SiGe layers where one or more of these layers may have a substantially constant Ge content. The layers grown during the first growth step 108 may be "deposited" by chemical vapor deposition ("CVD").

Increasing the temperature of the first growth step 108 so it is greater than about 850° C. can increase the growth rate to about 0.5 micron per minute. Nevertheless, a high growth rate may also be achieved at a lower temperature (e.g., between about 500° C. and about 750° C.) by including a plasma enhancement step 110. With the plasma enhancement step 110, the growth rate of the first growth step 108 typically increases to about 0.6 micron per minute. The plasma enhancement step 110 may include the use of low energy plasma.

Optionally, in one embodiment, cleaning step 102 is performed before the first growth step 108. In cleaning step 102 the substrate 202 is typically subjected to a wet process 104. Examples of the wet process 104 include the RCA clean, the IMEC clean, the Ohmi clean, and the DDC clean. Further, the cleaning step may be mechanically augmented (e.g., using ultrasonic or megasonic excitation). The cleaning step 102 can also include a $CO_2$-based process (e.g., cryogenic). Dry (e.g., plasma-enhanced) cleaning processes may be used as well. In some embodiments, the cleaning step 102 can include an anneal step 106 where the substrate 202 is placed in, for example, a hydrogen ambient (e.g., at 1150° C.) for a certain amount of time (e.g., ninety seconds). In any case, the cleaning step 102 removes contamination and other material detrimental to the semiconductor structure 200.

A planarization step 112 follows the first growth step 108. In the planarization step 112 the surface of the SiGe layer 204 is subjected to a chemical mechanical polishing step 114, or an ion beam etching step 116, or both. A result is that, after the planarization step 112, the surface of the SiGe layer 204 exhibits a surface roughness that is typically less than two Angstroms. This is an improvement over the typical twenty to fifty Angstrom surface roughness present in the as-grown SiGe layer 204.

Subsequent to the planarization step 112, some embodiments include another cleaning step 118. Cleaning step 118 can also include a wet process 120, or a dry process, or both, examples of which are discussed above. The cleaning step 118 can also include an anneal step 122, similar to that described above.

In one embodiment a SiGe regrowth layer 206 is disposed (e.g., deposited) on the substrate 202 after the planarization step 112. The SiGe regrowth layer 206 typically has a thickness greater than about 500 Angstroms although, in some embodiments, the thickness may be greater than about 5000 Angstroms or even greater then about one micron. In another embodiment, for reasons of, for example, economy, the thickness is minimized (e.g., less than about 500 Angstroms). Further, in one embodiment, the Ge concentration in the SiGe regrowth layer 206 is substantially equal to that in the SiGe layer 204.

Irrespective of the presence of the SiGe regrowth layer 206, a second growth step 124 is next performed where the substrate 202 is exposed to a gas mixture at a temperature less than or equal to about 750° C. In some embodiments this exposure occurs at a pressure less than or equal to about 760 Torr (absolute). The gas mixture typically includes Si, or Ge, or both. Some example gas mixtures are $SiH_4$—$GeH_4$, $SiH_2Cl_2$—$GeCl_4$, $SiH_2Cl_2$—$GeH_4$, $SiHCl_3$—$GeCl_4$, and $SiHCl_3$—$GeH_4$. Nevertheless, in one embodiment, the gas mixture used in the second growth step 124 has a lower decomposition temperature than the gas mixture used in the first growth step 108.

Using one or more of these gas mixtures, one or more strained layers 208, typically having a thickness less than about 500 Angstroms, are grown on the substrate 202. In some embodiments the growth rate of the strained layers 208 is less than the growth rate of the SiGe layer 204 in the first growth step 108. The strained layers 208 grown during the second growth step 124 may be "deposited" by chemical vapor deposition ("CVD"). Due, at least in part, to the low surface roughness achieved by the planarization step 112, the surface roughness of the one or more strained layers 208 is typically less than about five Angstroms. Controlling the thickness of the strained layers 208, as well as the temperature at which they are grown, also contributes to their final surface roughness. In one embodiment, a plasma-enhancement step 126 may be included in the second growth step 124. This typically results in increased growth rates at reduced temperatures. The plasma-enhancement step 126 may include the use of low energy plasma.

In further embodiments, the strained layer 208 includes one or more of strained Si, strained Ge, or strained SiGe. The strained layer 208 may also be tensilely or compressively strained. For example, in one embodiment, the strained layer 208 includes compressively strained Ge. The "strain" in the strained layer 208 may be induced by lattice mismatch with respect to an adjacent layer, as described above, or mechanically. For example, strain may be induced by the deposition of overlayers, such as $Si_3N_4$. Another way is to create underlying voids by, for example, implantation of one or more gases followed by annealing. Both of these approaches induce strain in the layer underlying the strained layer 208, which causes strain in the strained layer 208.

The substrate 202, SiGe layers 204, 206, strained layer 208, and an interface 210 between the SiGe layers 204, 206 and strained layer 208, are characterized, at least in part, by an impurity gradient 218A, 218B (collectively, 218). The impurity gradient 218 describes the concentration of the impurity species as a function of location across the substrate 202, the strained layer 208, layers near or adjacent to the strained layer 208 (e.g., the SiGe layers 204, 206) and the interface 210. The impurity gradient 218 may be determined by solving Fick's differential equations, which describe the transport of matter:

$$J = -D\frac{\partial N}{\partial x} \quad \text{(Equation 1)}$$

$$\frac{\partial N}{\partial t} = D\frac{\partial^2 N}{\partial x^2} \quad \text{(Equation 2)}$$

In equations (1) and (2), "J" is the impurity flux, "D" is the diffusion coefficient, and "N" is the impurity concentration. Equation (1) describes the rate of the permeation of the diffusing species through unit cross sectional area of the medium under conditions of steady state flow. Equation (2) specifies the rate of accumulation of the diffusing species at different points in the medium as a function of time, and applies to transient processes. In the general case, equations (1) and (2) are vector-tensor relationships that describe these phenomena in three dimensions. In some cases, equations (1) and (2) may be simplified to one dimension.

The steady state solution to equation (1), which is not detailed herein, is a function of the Gaussian error function:

$$erf(y) = \frac{2}{\sqrt{\pi}} \int_0^y e^{-z^2} dz \quad \text{(Equation 3)}$$

An example solution is shown in FIG. 2 as the impurity gradient 218. Axis 214 represents the impurity concentration, typically in units of $cm^{-3}$. Axis 216 corresponds to the location in the semiconductor structure 200. Axis 216 is aligned with the semiconductor structure 200 to illustrate a typical impurity profile, meaning that the impurity concentration at any point in the semiconductor structure 200 can be ascertained as a function of location. Except as described below, the depicted shape of the impurity gradient 218 is not intended to be limiting. For example, impurity gradient 218A may describe a profile of a p-type (e.g., boron) or n-type (e.g., phosphorous or arsenic) dopant introduced in the substrate 202 or elsewhere in the semiconductor structure 200. On the other hand, impurity gradient 218B may, for example, describe a substantially constant concentration of Ge, or Si, or both, in the substrate 102 that takes on a desired value (e.g., a reduced value) in the strained layer 208. Stated differently, the impurity gradient 218 may describe the concentration of any species in the substrate 202, including the substrate species itself, at any point in the semiconductor structure 200.

Boundary 220 represents the interface 210 between the SiGe regrowth layer 206 and the strained layer 208. (In embodiments lacking the SiGe regrowth layer 206, boundary 220 represents the interface between the SiGe layer 204 and the strained layer 208.) Boundary 222 depicts the start of a distal zone 212 of the strained layer 208. The distal zone is located away from the interface 210.

Boundary 224 corresponds to the edge of the strained layer 208. Of note are the locations where the boundaries 220, 222, 224 intersect the axis 216 and the impurity gradient 218. In particular, the impurity gradient 218 has a value substantially equal to zero in the distal zone 212. This is depicted by the impurity gradient 218 approaching the axis 216 at the boundary 222, and remaining there, or at zero, or at another value substantially equal to zero, between the boundary 222 and the boundary 224. Of course, the impurity gradient 218 can also have a value substantially equal to zero before reaching the boundary 222. In any case, one embodiment of the invention features a distal zone 212 that includes at least about fifty Angstroms of the furthest part of the strained layer 208. That is, the distal zone 212 is at least about fifty Angstroms thick.

Figure 3:
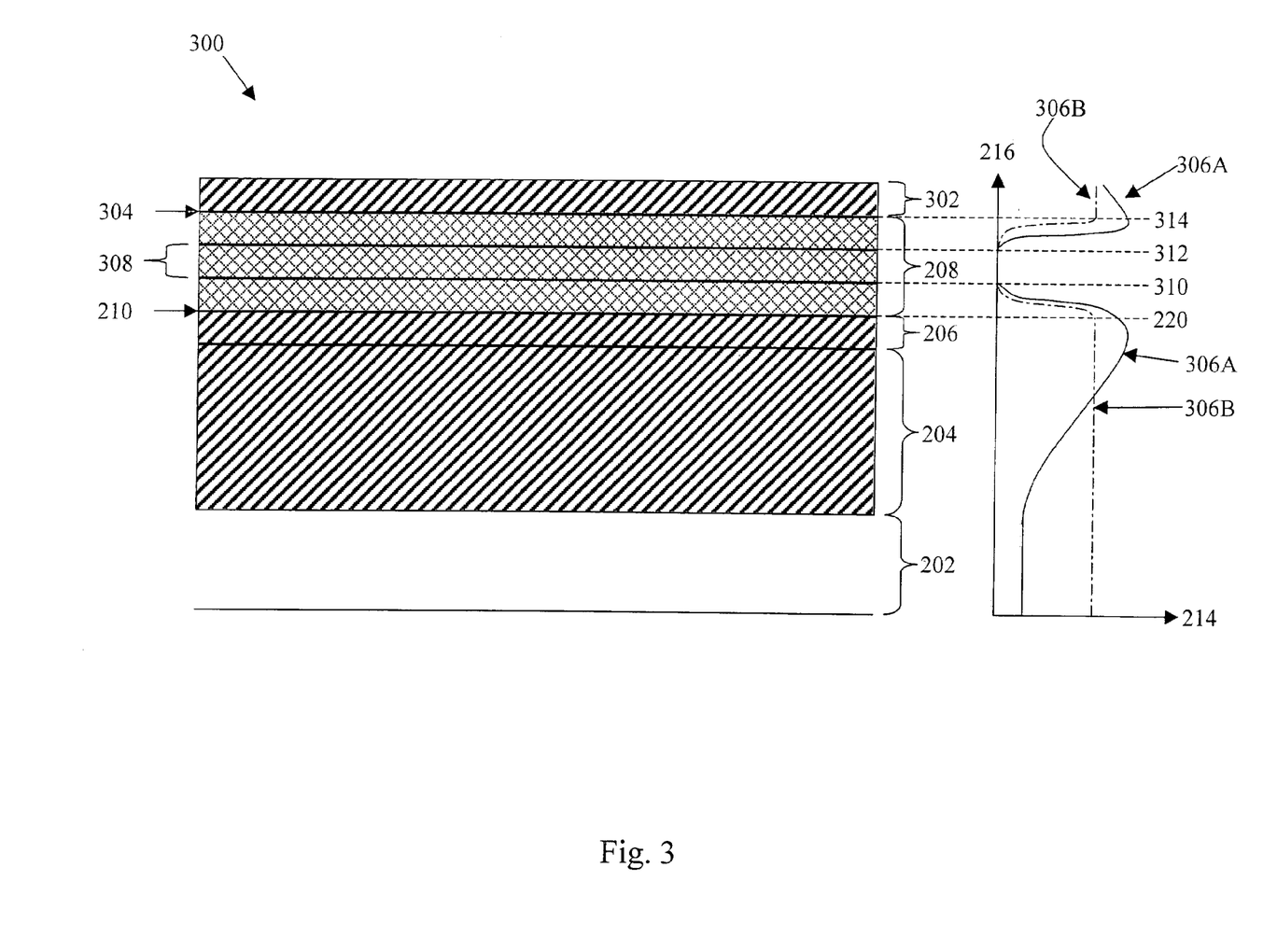
FIG. 3 is a schematic (unscaled) cross-sectional view that depicts another semiconductor structure in accordance with an embodiment of the invention.

FIG. 3 depicts another embodiment of a semiconductor structure 300 where the second growth step 124 followed by a step that disposes (e.g., deposits by CVD) one or more subsequent SiGe layers 302 on the strained layer 208. One or more of the subsequent SiGe 302 layers may be relaxed. An interface 304 is between the strained layer 208 and the subsequent SiGe 302 layers 302.

In a further embodiment, an impurity gradient, 306A, 306B (collectively, 306) describes the impurity concentration at any point in the semiconductor structure 300, including the subsequent SiGe layers 302. The illustrative example shown in FIG. 3 demonstrates that the impurity gradient 306 has a value substantially equal to zero in a zone 308 within the strained layer 208, but a non-zero value in other areas of the semiconductor structure 300, including in the subsequent SiGe layers 302. Boundaries 310, 312 define the limits of the zone 308, and a boundary 314 corresponds to the interface 304. Stated differently, the impurity gradient 306 has a value substantially equal to zero between the boundaries 310, 312. This is depicted by the impurity gradient 306 approaching the axis 216 at the boundaries 310, 312 and remaining there, or at zero, or at another value substantially equal to zero, between the boundaries 310, 312. Of course, the impurity gradient 306 can also have a value substantially equal to zero before reaching the boundary 310 or the boundary 312. Between the boundaries 312, 314, and outside of the boundary 314, the impurity gradient 306 may have any value (e.g., zero or non-zero).

The depicted shape of the impurity gradient 306 is not intended to be limiting. As discussed above regarding the impurity gradient 218, the impurity gradient 306 may describe a profile of a dopant introduced in the semiconductor structure 300. The impurity gradient 306 may also describe the concentration of any species in the substrate 202, including the substrate species itself, at any point in the semiconductor structure 300.

In one embodiment, a distal zone away from the interface 210 between the strained layer 208 and an adjacent layer (e.g., the SiGe regrowth layer 206 or the SiGe layer 204) begins at a point that coincides generally with the boundary 310. Further, a distal zone away from the interface 304 between the strained layer 208 and an adjacent layer (e.g., the subsequent SiGe layers 302) begins at a point that coincides generally with the boundary 312. The aggregation of these two distal zones forms the zone 308 where the impurity gradient 306 has a value substantially equal to zero. One embodiment features distal zones that include at least fifty Angstroms of the strained layer In the aggregation of the distal zones depicted in FIG. 3, this results in the zone 308 being at least about 50 Angstroms thick.

In another embodiment, a growth step may be performed on a semiconductor substrate that has one or more preexisting material layers thereon. The thickness of these preexisting material layers is, for example, greater than about 200 Angstroms, either individually or in the aggregate. In this embodiment the substrate, which may include any of the substrate materials discussed above, is exposed to a gas mixture that contains Si, or Ge, or both, (see, e.g., the example gas mixtures described above) at a temperature less than or equal to about 750° C. This generally results in the growth (by, e.g., CVD) of a strained layer having a thickness less than about 500 Angstroms. The typical growth rate of the strained layer is about 0.2 micron per minute, or less. In one embodiment, the growth step includes plasma-enhancement. This typically results in increased growth rates at reduced temperatures. The plasma-enhancement may include the use of low energy plasma.

In a related embodiment, the one or more preexisting material layers include SiGe, which may be substantially relaxed. These layers may also include one or more insulating layers (e.g., $SiO_2$ or $Si_3N_4$, doped or undoped). Further embodiments include the step of planarizing one or more of the preexisting material layers before subjecting the semiconductor substrate to the growth step. As discussed above, this planarization may be accomplished by, for example, chemical mechanical polishing, or ion beam etching, or both. Optionally, the one or more preexisting material layers may be cleaned (e.g., by using a wet process, dry process, or anneal, all as described above) before or after the growth step.

Efficiency and yield are generally improved when semiconductor fabrication is accomplished using a minimum number of process tools. This allows semiconductor substrates (e.g., wafers) to move between different processing environments while limiting their handling and exposure to unclean surroundings. This is a basis of the "cluster tool" concept. Typically, a conventional controller manages the various process steps occurring within a cluster tool. The controller may be, for example, a computer or other programmable apparatus. In general, the controller directs the operation of one or more aspects of the tool using, for example, standard or custom software. An equipment operator, in turn, interacts with the controller.

Of course, it may be difficult or impossible to perform certain processing steps within a single or limited (e.g., minimum) number of process tools. Further, wafers must be loaded and unloaded from the tool(s) at the beginning and end of fabrication. Accordingly, the tool(s) generally include a load lock station where an operator can access the wafers and, for example, move them in or out of the tool(s).

In one embodiment, one or more of the steps encompassed by the fabrication method 100 occur in a single process tool, or at least in a limited number of process tools. For example, the first growth step 108 and the second growth step 124 can be performed in separate CVD chambers in a single process tool. Alternatively, and notwithstanding their different process parameters (e.g., gas mixture, temperature, etc.), these steps may be performed in a single CVD chamber in a single process tool. Of course, these steps may also be performed in separate (e.g., dedicated) process tools.

In a further embodiment, one or more of the cleaning steps 102, 118, the first growth step 108, and the second growth step 124 may be performed in a single process tool. For example, one or more of the cleaning steps 102, 118 may be performed in one chamber, and the growth steps 108, 124 may be performed in one or more other chambers. In any event, integrating one or more of the cleaning steps 102, 118 into the same process tool as that used for the growth steps 108, 124 typically occurs if the cleaning steps 102, 118 used the corresponding anneal processes 106, 122, or a dry process, as the cleaning mechanism. Clearly, one or more of the cleaning steps 102, 118 may also be performed in one or more process tools that are separate from that used for the growth steps 108, 124.

Semiconductor structures fabricated in accordance with embodiments of the invention typically have a threading dislocation density less than $10^6$ cm$^{-2}$ and, in some instances, less than $10^5$ cm$^{-2}$. Further, particle density is typically less than 0.3 cm$^{-2}$. The relaxed $Si_{1-x}Ge_x$ layers produced in accordance with an embodiment of invention typically have localized light-scattering defect levels, which are related to particle size (diameter), as described in the following table:

| Approximate Particle Size (Diameter) [microns] | Approximate Defect Level [cm$^{-2}$] |
|---|---|
| Greater than 0.13 | 0.3 |
| Greater than 0.16 | 0.2 |
| Greater than 0.2 | 0.1 |
| Greater than 1 | 0.03 |

Further process enhancements suggest that localized light-scattering defect levels will be reduced to 0.09 cm$^{-2}$ and 0.05 cm$^{-2}$ for particle sizes (diameters) greater than about 0.09 microns and 0.12 microns, respectively.

From the foregoing, it will be appreciated that the methods of fabricating semiconductor structures provided by the invention afford a simple and effective way to produce multi-layered, strained material configurations under conditions optimized for each layer. Inefficiencies and yield degradation due to excessive wafer handling and transport between several dedicated process tools are largely eliminated.

One skilled in the art will realize the invention may be embodied in other specific forms without departing from the spirit or essential characteristics thereof. The foregoing embodiments are therefore to be considered in all respects illustrative rather than limiting of the invention described herein. Scope of the invention is thus indicated by the appended claims, rather than by the foregoing description, and all changes that come within the meaning and range of equivalency of the claims are therefore intended to be embraced therein.

What is claimed is:

1. A method for fabricating a semiconductor structure on a substrate, the method comprising the steps of:
    exposing the substrate to a first gas mixture at a temperature greater than about 500° C., thereby disposing on the substrate at a first growth rate at least one layer of SiGe having a thickness greater than about 1000 Angstroms, wherein the first gas mixture comprises at least one of Si and Ge;
    planarizing the at least one layer of SiGe; and
    thereafter, exposing the substrate to a second gas mixture at a temperature less than or equal to about 750° C., thereby disposing on the substrate at a second growth rate at least one strained layer having a thickness less than about 500 Angstroms, wherein the second gas mixture comprises at least one of Si and Ge.

2. The method of claim 1 wherein the substrate comprises Si.

3. The method of claim 1 wherein the substrate comprises SiGe.

4. The method of claim 1 wherein the first growth rate is greater than about 0.2 micron per minute.

5. The method of claim 1 wherein the first gas mixture is $SiH_4$—$GeH_4$.

6. The method of claim 1 wherein the first gas mixture is $SiH_2Cl_2$—$GeCl_4$.

7. The method of claim 1 wherein the first gas mixture is $SiH_2Cl_2$—$GeH_4$.

8. The method of claim 1 wherein the first gas mixture is $SiHCl_3$—$GeCl_4$.

9. The method of claim 1 wherein the first gas mixture is $SiHCl_3$—$GeH_4$.

10. The method of claim 1 wherein the at least one layer of SiGe is substantially relaxed.

11. The method of claim 1 wherein the at least one layer of SiGe comprises compositionally graded SiGe.

12. The method of claim 11 wherein the at least one layer of SiGe comprises at least one layer having substantially constant Ge content.

13. The method of claim 1 wherein the step of exposing the substrate to a first gas mixture comprises plasma enhancement.

14. The method of claim 1 wherein the step of exposing the substrate to a first gas mixture occurs at a temperature greater than about 850° C.

15. The method of claim 1 wherein the step of disposing the at least one layer of SiGe occurs at a pressure less than or equal to about 760 Torr.

16. The method of claim 1 wherein the at least one layer of SiGe has a thickness greater than about one micron.

17. The method of claim 1 wherein the step of planarizing the at least one layer of SiGe comprises at least one of chemical mechanical polishing and ion beam etching.

18. The method of claim 1 wherein the at least one strained layer comprises strained Si.

19. The method of claim 1 wherein the at least one strained layer comprises strained Ge.

20. The method of claim 1 wherein the at least one strained layer comprises strained SiGe.

21. The method of claim 1 wherein the at least one strained layer comprises at least one tensilely strained layer.

22. The method of claim 1 wherein the at least one strained layer comprises at least one compressively strained layer of SiGe.

23. The method of claim 1 wherein the at least one strained layer comprises at least one compressively strained layer of Ge.

24. The method of claim 1 wherein the second growth rate is less than the first growth rate.

25. The method of claim 1 wherein the second gas mixture has a lower decomposition temperature than that of the first gas mixture.

26. The method of claim 1 wherein the second gas mixture is $SiH_4$—$GeH_4$.

27. The method of claim 1 wherein the second gas mixture is $SiH_2Cl_2$—$GeCl_4$.

28. The method of claim 1 wherein the second gas mixture is $SiH_2Cl_2$—$GeH_4$.

29. The method of claim 1 wherein the second gas mixture is $SiHC_3$—$GeCl_4$.

30. The method of claim 1 wherein the second gas mixture is $SiHC_3$—$GeH_4$.

31. The method of claim 1 wherein the step of exposing the substrate to a second gas mixture comprises plasma enhancement.

32. The method of claim 1 wherein the step of disposing the at least one strained layer occurs at a pressure less than or equal to about 760 Torr.

33. The method of claim 1 further comprising the step of placing the substrate in at least one load lock.

34. The method of claim 1 wherein the steps of exposing the substrate to the first and second gas mixtures occur within a single process tool.

35. The method of claim 34 wherein the steps of exposing the substrate to the first and second gas mixtures occur in separate CVD chambers.

36. The method of claim 34 wherein the steps of exposing the substrate to the first and second gas mixtures occur within a single CVD chamber.

37. The method of claim 1 wherein the steps of exposing the substrate to the first and second gas mixtures occur in separate process tools.

38. The method of claim 1 further comprising the step of disposing on the substrate at least one SiGe regrowth layer after the step of planarizing the at least one layer of SiGe and before the step of disposing on the substrate at least one strained layer.

39. The method of claim 38 wherein the at least one SiGe regrowth layer has a thickness greater than about 500 Angstroms.

40. The method of claim 38 wherein the at least one SiGe regrowth layer has a thickness greater than about 5000 Angstroms.

41. The method of claim 38 wherein the at least one SiGe regrowth layer has a thickness greater than about one micron.

42. The method of claim 38 wherein the at least one SiGe regrowth layer has a Ge content substantially equal to that of the at least one layer of SiGe.

43. The method of claim 1 further comprising the step of disposing on the substrate at least one subsequent SiGe layer after the step of disposing on the substrate at least one strained layer.

44. The method of claim 43 wherein the at least one subsequent SiGe layer is substantially relaxed.

45. The method of claim 1 further comprising the step of cleaning the substrate before at least one of the steps of (i) disposing on the substrate at least one layer of SiGe, and (ii) disposing on the substrate at least one strained layer.

46. The method of claim 45 wherein the cleaning step comprises at least one of a wet processing step and an annealing step.

47. The method of claim 45 wherein the cleaning step and the steps of exposing the substrate to the first and second gas mixtures occur within a single process tool.

48. The method of claim 47 wherein the cleaning step occurs in a first chamber and the steps of exposing the substrate to the first and second gas mixtures occur in at least one second chamber.

49. The method of claim 45 wherein the cleaning step and the steps of exposing the substrate to the first and second gas mixtures occur in separate process tools.

50. The method of claim 1 wherein the at least one strained layer and at least one adjacent layer define at least one interface therebetween, the at least one strained layer has at least one distal zone away from the at least one interface, and wherein the substrate, the at least one adjacent layer, the at least one interface, and the at least one strained layer are characterized at least in part by an impurity gradient having a value substantially equal to zero in the at least one distal zone.

51. The method of claim 50 wherein the at least one adjacent layer comprises at least one layer of SiGe.

52. The method of claim 50 wherein the at least one distal zone comprises at least about fifty Angstroms of the at least one strained layer.

53. The method of claim 50 wherein the impurity gradient describes at least the concentration of Si.

54. The method of claim 50 wherein the impurity gradient describes at least the concentration of Ge.

* * * * *

UNITED STATES PATENT AND TRADEMARK OFFICE
CERTIFICATE OF CORRECTION

PATENT NO. : 7,060,632 B2 Page 1 of 1
APPLICATION NO. : 10/389003
DATED : June 13, 2006
INVENTOR(S) : Fitzgerald et al.

It is certified that error appears in the above-identified patent and that said Letters Patent is hereby corrected as shown below:

Column 11;
Claim 29 beginning on line 31 should read:

-- 29. The method of claim 1 wherein the second gas mixture is $SiHCl_3$-$GeCl_4$. --

Claim 30 beginning on line 33 should read:

-- 30. The method of claim 1 wherein the second gas mixture is $SiHCl_3$-$GeH_4$. --

Signed and Sealed this

Seventh Day of August, 2007

JON W. DUDAS
*Director of the United States Patent and Trademark Office*